(12) United States Patent
Bushman et al.

(10) Patent No.: US 7,706,595 B2
(45) Date of Patent: Apr. 27, 2010

(54) PICK AND PLACE MACHINE WITH WORKPIECE MOTION INSPECTION

(75) Inventors: Thomas W. Bushman, Marblehead, MA (US); David D. Madsen, Lakeland, MN (US); Paul R. Haugen, Bloomington, MN (US); Steven K. Case, Minnetonka, MN (US); John D. Gaida, Victoria, MN (US); M. Hope Madsen, Lakeland, MN (US)

(73) Assignee: CyberOptics Corporation, Golden Valley, MN (US)

( * ) Notice: Subject to any disclaimer, the term of this patent is extended or adjusted under 35 U.S.C. 154(b) by 1032 days.

(21) Appl. No.: 10/978,687

(22) Filed: Nov. 1, 2004

(65) Prior Publication Data

US 2005/0123187 A1 Jun. 9, 2005

Related U.S. Application Data

(60) Provisional application No. 60/518,153, filed on Nov. 7, 2003.

(51) Int. Cl.
*G06K 9/00* (2006.01)
(52) U.S. Cl. ..................................... 382/141
(58) Field of Classification Search ................ 382/100, 382/141, 144–152, 153; 348/86–90, 125–130; 29/833–840; 438/16–20; 702/34–40
See application file for complete search history.

(56) References Cited

U.S. PATENT DOCUMENTS 3,814,845 A 6/1974 Hurlbrink, III et al. ....... 178/6.8

(Continued)

FOREIGN PATENT DOCUMENTS

CN 1317926 10/2001

(Continued)

OTHER PUBLICATIONS

The International Preliminary Report on Patentability for foreign application No. PCT/US2004/036238 filed Oct. 29, 2004; Notification of Transmittal of the International Search Report and Written Opinion of the International Searching Authority for application No. PCT/US2004/036238, filed Oct. 29, 2004.

(Continued)

*Primary Examiner*—Samir A. Ahmed
*Assistant Examiner*—Atiba O Fitzpatrick
(74) *Attorney, Agent, or Firm*—Christopher R. Christenson; Westman, Champlin & Kelly, P.A.

(57) ABSTRACT

Embodiments include measuring motion characteristics of the workpiece through the placement process. Since the component is placed on the workpiece with some force to ensure proper adhesion to the workpiece, some deflection of the workpiece is expected during the placement cycle. The placement force is adjusted to ensure that the component is safely placed into the solder paste or adhesive. Placement force is adjusted through a number of characteristics including: choice of spring tension in the nozzle; the length of the nozzle and the amount of over-travel into the board; the rigidity of the board and design; and the placement of the board support mechanisms. With proper adjustment of these characteristics and parameters, high quality placements onto the workpiece can be ensured.

7 Claims, 10 Drawing Sheets

U.S. PATENT DOCUMENTS

| | | | |
|---|---|---|---|
| 4,281,342 A | 7/1981 | Ueda et al. | 348/94 |
| 4,589,140 A * | 5/1986 | Bishop et al. | 382/148 |
| 4,776,088 A | 10/1988 | Biggs et al. | 29/834 |
| 4,805,111 A | 2/1989 | Steidel | 364/469 |
| 4,809,430 A | 3/1989 | Maryuama et al. | 29/834 |
| 4,825,091 A | 4/1989 | Breyer et al. | 250/559.38 |
| 4,914,513 A | 4/1990 | Spigarelli et al. | 358/101 |
| 4,978,224 A | 12/1990 | Kishimoto et al. | 356/394 |
| 4,989,082 A | 1/1991 | Hopkins | 358/101 |
| 4,999,785 A | 3/1991 | Schmuter | 364/507 |
| 5,003,692 A | 4/1991 | Izumi et al. | 29/834 |
| 5,023,916 A | 6/1991 | Breu | 382/8 |
| 5,060,366 A | 10/1991 | Asai et al. | 29/739 |
| 5,086,559 A | 2/1992 | Akatsuchi | 29/834 |
| 5,105,149 A | 4/1992 | Tokura | 324/158 |
| 5,127,061 A | 6/1992 | Amir et al. | 382/1 |
| 5,129,725 A | 7/1992 | Ishizuka et al. | 356/617 |
| 5,134,665 A | 7/1992 | Jyoko | 382/8 |
| 5,194,791 A | 3/1993 | Cull | 318/568.1 |
| 5,235,316 A | 8/1993 | Qualizza | 340/436 |
| 5,237,622 A | 8/1993 | Howell | 382/8 |
| 5,249,349 A | 10/1993 | Kuinose et al. | 29/721 |
| 5,278,634 A | 1/1994 | Skunes | 356/400 |
| 5,298,977 A | 3/1994 | Shintani et al. | 356/376 |
| 5,336,935 A | 8/1994 | Shitanda et al. | 307/116 |
| 5,377,405 A | 1/1995 | Sakurai et al. | 29/833 |
| 5,383,270 A | 1/1995 | Iwatsuka et al. | 29/840 |
| 5,384,956 A | 1/1995 | Sakurai et al. | 29/834 |
| 5,392,360 A | 2/1995 | Weindelmayer et al. | 382/8 |
| 5,450,204 A | 9/1995 | Shigeyama et al. | 356/604 |
| 5,461,480 A | 10/1995 | Yamada et al. | 256/394 |
| 5,467,186 A | 11/1995 | Indo et al. | 356/150 |
| 5,471,310 A | 11/1995 | Spigarelli et al. | 356/399 |
| 5,495,424 A | 2/1996 | Tokura | 364/507 |
| 5,537,204 A | 7/1996 | Woodhouse | 356/243 |
| 5,541,834 A | 7/1996 | Tomigashi et al. | 364/167.01 |
| 5,550,583 A | 8/1996 | Amir et al. | 348/126 |
| 5,566,447 A | 10/1996 | Sakurai | 294/832 |
| 5,589,942 A | 12/1996 | Gordon | 356/611 |
| 5,598,345 A | 1/1997 | Takura | 364/489 |
| 5,619,328 A | 4/1997 | Sakurai | 356/375 |
| 5,627,913 A | 5/1997 | Spigarelli et al. | 382/151 |
| 5,660,519 A | 8/1997 | Ohta et al. | 414/783 |
| 5,686,994 A | 11/1997 | Tokura | 356/394 |
| 5,719,952 A | 2/1998 | Rooks | 382/150 |
| 5,724,722 A | 3/1998 | Hashimoto | 29/740 |
| 5,739,846 A | 4/1998 | Gieskes | 348/87 |
| 5,745,241 A | 4/1998 | Hashimoto | 356/384 |
| 5,749,142 A | 5/1998 | Hanamura | 29/833 |
| 5,754,677 A | 5/1998 | Kawada | 382/141 |
| 5,835,133 A | 11/1998 | Moreton et al. | 348/49 |
| 5,839,186 A | 11/1998 | Onodera | 29/720 |
| 5,878,151 A | 3/1999 | Tang et al. | 382/103 |
| 5,900,940 A | 5/1999 | Aoshima | 356/375 |
| 5,903,353 A | 5/1999 | Raymond | 356/620 |
| 5,908,282 A | 6/1999 | Onodea | 414/783 |
| 5,911,001 A | 6/1999 | Kawada | 382/141 |
| 5,912,984 A | 6/1999 | Michael et al. | 382/149 |
| 5,949,681 A | 9/1999 | Asai et al. | 700/113 |
| 5,956,149 A | 9/1999 | Suzuki et al. | 356/375 |
| 5,969,820 A | 10/1999 | Yoshi et al. | 356/375 |
| 5,982,927 A | 11/1999 | Koljonen | 382/168 |
| 6,027,019 A | 2/2000 | Kou | 235/375 |
| 6,047,084 A | 4/2000 | Kent et al. | 382/147 |
| 6,079,098 A | 6/2000 | Soellner et al. | 29/832 |
| 6,167,607 B1 | 1/2001 | Pryor | 29/407.04 |
| 6,195,165 B1 | 2/2001 | Sayegh | 356/376 |
| 6,198,529 B1 | 3/2001 | Clark et al. | 356/237.5 |
| 6,223,425 B1 | 5/2001 | Asai et al. | 29/740 |
| 6,240,633 B1 | 6/2001 | Kent et al. | 29/832 |
| 6,286,202 B1 | 9/2001 | Asai et al. | 39/740 |
| 6,317,972 B1 | 11/2001 | Asai et al. | 29/833 |
| 6,332,536 B2 | 12/2001 | Easton | 206/459.5 |
| 6,334,840 B1 | 1/2002 | Asai et al. | 483/1 |
| 6,404,847 B1 | 6/2002 | Ueki et al. | 378/45 |
| 6,408,090 B1 | 6/2002 | Salomon et al. | 382/145 |
| 6,478,533 B2 | 11/2002 | Davis, III | 414/816 |
| 6,506,614 B1 | 1/2003 | Strassmann | 438/7 |
| 6,522,777 B1 | 2/2003 | Paulsen et al. | 382/154 |
| 6,538,244 B1 | 3/2003 | Skunes | 250/208.1 |
| 6,538,750 B1 | 3/2003 | Fishbaine et al. | 356/614 |
| 6,549,647 B1 | 4/2003 | Skunes et al. | 382/150 |
| 6,583,884 B2 | 6/2003 | Rudd et al. | 356/601 |
| 6,608,320 B1 | 8/2003 | Skunes et al. | 250/559.19 |
| 6,616,263 B2 | 9/2003 | Allen et al. | 347/19 |
| 6,622,054 B1 | 9/2003 | Okuda et al. | 700/51 |
| 6,681,151 B1 | 1/2004 | Weinzimmer et al. | 700/259 |
| 6,718,626 B2 | 4/2004 | Kawada | 29/740 |
| 6,738,505 B1 | 5/2004 | Prince | 382/150 |
| 6,744,499 B2 | 6/2004 | Skunes et al. | 356/243.1 |
| 6,748,649 B2 | 6/2004 | Okuda et al. | 29/740 |
| 6,762,847 B2 | 7/2004 | Durquette et al. | 356/614 |
| 6,778,878 B1 | 8/2004 | Kou | 700/221 |
| 6,801,652 B1 | 10/2004 | Stanzl et al. | 382/147 |
| 6,807,725 B2 | 10/2004 | Asai et al. | 29/740 |
| 6,891,967 B2 | 5/2005 | Prince | 382/150 |
| 6,966,235 B1 | 11/2005 | Paton | 73/865.9 |
| 6,987,530 B2 * | 1/2006 | McConica | 348/208.6 |
| 7,029,224 B2 | 4/2006 | Kubo et al. | 414/680 |
| 7,043,824 B2 | 5/2006 | Suhara et al. | 29/740 |
| 7,083,082 B2 | 8/2006 | Byskov et al. | 235/375 |
| 7,239,399 B2 | 7/2007 | Duquette et al. | 356/614 |
| 2001/0033386 A1 | 10/2001 | Kranz et al. | 356/601 |
| 2001/0040117 A1 | 11/2001 | Easton | 206/714 |
| 2002/0014003 A1 | 2/2002 | Asai et al. | 29/740 |
| 2002/0031279 A1 | 3/2002 | Shimizu | 382/291 |
| 2002/0053133 A1 | 5/2002 | Suhara et al. | 29/700 |
| 2002/0069395 A1 | 6/2002 | Fujwara et al. | 716/4 |
| 2002/0078580 A1 | 6/2002 | Haugen et al. | 33/533 |
| 2002/0099466 A1 | 7/2002 | Diggin et al. | 700/121 |
| 2002/0112064 A1 | 8/2002 | Eastvold | 709/230 |
| 2002/0124391 A1 | 9/2002 | Kawai et al. | 29/739 |
| 2002/0133940 A1 | 9/2002 | Kadomatsu et al. | 29/832 |
| 2002/0143423 A1 | 10/2002 | Huber et al. | 700/121 |
| 2003/0027363 A1 | 2/2003 | Kodama | 438/14 |
| 2003/0029033 A1 | 2/2003 | Hidese et al. | 29/833 |
| 2003/0098426 A1 | 5/2003 | Hayata | 250/559.34 |
| 2003/0110610 A1 | 6/2003 | Duquette et al. | 29/407.09 |
| 2003/0111494 A1 | 6/2003 | Lin et al. | 222/505 |
| 2003/0125895 A1 | 7/2003 | Kawai et al. | 702/117 |
| 2003/0159515 A1 | 8/2003 | Tonomura | 73/584 |
| 2003/0219330 A1 | 11/2003 | Lyndaker et al. | 414/411 |
| 2003/0225547 A1 | 12/2003 | Paradies | 702/150 |
| 2004/0094594 A1 | 5/2004 | Liebeke | 226/32 |
| 2004/0119987 A1 | 6/2004 | Madsen et al. | 356/614 |
| 2004/0135884 A1 * | 7/2004 | Saeki | 348/86 |
| 2004/0163243 A1 | 8/2004 | Noda et al. | 29/834 |
| 2004/0184653 A1 * | 9/2004 | Baer et al. | 382/145 |
| 2004/0186616 A1 | 9/2004 | Overman et al. | 700/224 |
| 2005/0077340 A1 | 4/2005 | Nagafuku et al. | 228/8 |
| 2005/0097035 A1 | 5/2005 | Likas et al. | 705/39 |
| 2005/0115060 A1 | 6/2005 | Kondo | 29/650 |
| 2005/0117797 A1 | 6/2005 | Gaida | 382/153 |
| 2005/0123187 A1 | 6/2005 | Bushman | 382/141 |
| 2005/0125993 A1 | 6/2005 | Madsen et al. | 29/739 |
| 2005/0137979 A1 | 6/2005 | Rekeweg et al. | 705/42 |
| 2005/0161498 A1 | 7/2005 | Byskov et al. | 235/376 |
| 2005/0210832 A1 | 9/2005 | Tassin et al. | 53/396 |
| 2005/0235913 A1 | 10/2005 | Prentice et al. | 118/712 |
| 2005/0268460 A1 | 12/2005 | Case | 29/833 |
| 2005/0276464 A1 | 12/2005 | Duquette et al. | 382/151 |
| 2006/0016066 A1 | 1/2006 | Gaida et al. | 29/740 |
| 2006/0075631 A1 | 4/2006 | Case et al. | 29/709 |
| 2006/0174480 A1 | 8/2006 | Kawada | 29/833 |

| | | | |
|---|---|---|---|
| 2007/0003126 A1 | 1/2007 | Case et al. | 382/141 |
| 2007/0010969 A1 | 1/2007 | Madsen et al. | 702/183 |

FOREIGN PATENT DOCUMENTS

| | | |
|---|---|---|
| CN | 1438836 | 8/2003 |
| EP | 0 664 666 B1 | 8/1997 |
| EP | 0 932 331 A1 | 7/1999 |
| EP | 0 948 250 | 10/1999 |
| EP | 0 959 654 | 11/1999 |
| EP | 1 152 604 | 11/2001 |
| EP | 1 343 363 | 9/2003 |
| GB | 2 317 496 | 3/1998 |
| JP | 62298750 | 12/1987 |
| JP | 63090707 | 4/1988 |
| JP | 02076080 | 3/1990 |
| JP | 04031974 | 2/1992 |
| JP | 5-37918 | 2/1993 |
| JP | 05251897 | 9/1993 |
| JP | 06053694 | 2/1994 |
| JP | 06201532 | 7/1994 |
| JP | 6-249629 | 9/1994 |
| JP | 6-249630 | 9/1994 |
| JP | 6-310899 | 11/1994 |
| JP | 07037063 | 2/1995 |
| JP | 7-77319 | 8/1995 |
| JP | 7-336099 | 12/1995 |
| JP | 8032291 | 2/1996 |
| JP | 8-111598 | 4/1996 |
| JP | 9-021609 | 1/1997 |
| JP | 9-023097 | 1/1997 |
| JP | 09193515 | 7/1997 |
| JP | 9-205299 | 8/1997 |
| JP | 9-210626 | 8/1997 |
| JP | 9-214198 | 8/1997 |
| JP | 9-223898 | 8/1997 |
| JP | 9-246799 | 9/1997 |
| JP | 10136962 | 5/1998 |
| JP | 11-168300 | 6/1999 |
| JP | 9-293998 | 9/1999 |
| JP | 11285925 | 10/1999 |
| JP | 2000-022392 | 1/2000 |
| JP | 2000339456 | 12/2000 |
| JP | 2000349499 A | 12/2000 |
| JP | 2001-165860 | 6/2001 |
| JP | 2001-168600 | 6/2001 |
| JP | 2001168594 | 6/2001 |
| JP | 2001177836 | 6/2001 |
| JP | 01309190 | 11/2001 |
| JP | 02235399 | 8/2002 |
| JP | 2002271099 | 9/2002 |
| JP | 2003-8259 | 1/2003 |
| JP | 2003-092495 | 3/2003 |
| JP | 2003152392 | 5/2003 |
| JP | 2003-243898 | 8/2003 |
| JP | 2003243899 | 8/2003 |
| JP | 2003-304095 | 10/2003 |
| JP | 2005285840 | 10/2005 |
| JP | 07183697 | 7/2007 |
| WO | WO 98/24293 | 6/1998 |
| WO | WO 99/49713 | 9/1999 |
| WO | WO 00/19794 | 4/2000 |
| WO | WO 00/19800 | 4/2000 |
| WO | WO 00/26640 | 5/2000 |
| WO | WO 00/38494 | 6/2000 |
| WO | WO 01/67831 A2 | 9/2001 |
| WO | WO 02/29357 | 4/2002 |
| WO | WO 02/46713 | 6/2002 |
| WO | WO 03/043400 A1 | 5/2003 |
| WO | WO 2005/115073 | 12/2005 |
| WO | WO 2006/125102 | 11/2006 |

OTHER PUBLICATIONS

Chinese Office Action from Application No. 02826679.X, filed Nov. 12, 2002.
International Search Report and Written Opinion from application No. PCT/US05/017425, filed May 18, 2005; Notification of Transmittal of the International Preliminary Report from application No. PCT/US05/017425, filed May 18, 2005.
The Notification of Transmittal of International Preliminary Examination Report in foreign application No. 2005/025905, filed Jul. 21, 2005; International Search Report and Written Opinion from foreign application No. 2005/025905, filed Jul. 21, 2005.
The International Search Report from Appln No. PCT/US/2002/36154, filed Nov. 11, 2002.
The International Preliminary Report on Patentability in foreign Appln No. PCT/US/2004/036704, filed Nov. 3, 2004; Notification of Transmittal of the International Search Report and Written Opinion of the International Searching Authority in foreign Appln No. PCT/US/2004/036704, filed Nov. 3, 2004.
The International Preliminary Report on Patentability from Appln No. PCT/US/2005/35985, filed Oct. 5, 2005; International Search Report and Written Opinion from Appln No. PCT/US/2005/35985, filed Oct. 5, 2005.
International Search Report from Appln No. PCT/US2004/036683, filed Nov. 3, 2004.
The International Search Report and Written Opinion from Appln No. PCT/US/2006/019281, filed May 18, 2006.
International Preliminary Report on Patentability from Application No. PCT/US2004/036683, filed Nov. 3, 2004.
Notice of Preliminary Rejection for Korean patent application No. 10-2004-7007281, dated Jul. 30, 2009.
Rejection Notice for Japanese patent application No. 2003-0545092, dated May 19, 2008.
Rejection Notice for Japanese patent application No. 2003-545092, dated Jan. 18, 2008.
International Search Report and Written Opinion for international patent application No. PCT/US2006/042337, dated Mar. 8, 2007.
International Search Report and Written Opinion for international patent application No. PCT/US2006/035954, dated Jan. 1, 2007.
International Search Report and Written Opinion for international patent application No. PCT/US2007/011819, dated Jan. 16, 2008.
Official Action for Japanese patent application No. 2006-539579, mailed Jul. 28, 2009.
Official Action for Japanese patent application No. 2006-539635, mailed Jul. 28, 2009.
Machine translation of Japanese patent application No. JP 06-201532.

* cited by examiner

PICK AND PLACE MACHINE WITH WORKPIECE MOTION INSPECTION

CROSS-REFERENCE TO RELATED APPLICATIONS

The present application is based on and claims the benefit of U.S. provisional patent application Ser. No. 60/518,153, filed Nov. 7, 2003, the content of which is hereby incorporated by reference in its entirety.

COPYRIGHT RESERVATION

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Pick and place machines are generally used to manufacture electronic circuit boards. A blank printed circuit board is usually supplied to the pick and place machine, which then picks electronic components from component feeders, and places such components upon the board. The components are held upon the board temporarily by solder paste, or adhesive, until a subsequent step in which the solder paste is melted or the adhesive is fully cured.

Pick and place machine operation is challenging. Since machine speed corresponds with throughput, the faster the pick and place machine runs, the less costly the manufactured board will be. Additionally, placement accuracy is extremely important. Many electrical components, such as chip capacitors and chip resistors are relatively small and must be accurately placed on equally small placement locations. Other components, while larger, have a significant number of leads or conductors that are spaced from one another at a relatively fine pitch. Such components must also be accurately placed to ensure that each lead is placed upon the proper pad. Thus, not only must the machine operate extremely fast, but it must also place components extremely accurately.

In order to enhance the quality of board manufacture, fully or partially populated boards are generally inspected after the placement operation(s), both before and after solder reflow, to identify components that are improperly placed or missing or any of a variety of errors that may occur. Automatic systems that perform such operation(s) are highly useful because they help identify component placement problems prior to solder reflow. This allows substantially easier rework and/or the identification of defective boards after reflow that are candidates for rework. One example of such a system is sold under the trade designation Model KS Flex available from CyberOptics Corporation of Golden Valley, Minnesota. This system can be used to identify such problems as alignment and rotation errors; missing and flipped components; billboards; tombstones; component defects; incorrect polarity; and wrong components.

Identification of errors pre-reflow provides a number of advantages. Rework is easier; closed-loop manufacturing control is facilitated; and less work in-process exists between error generation and remedy. While such systems provide highly useful inspection, they do consume plant floor-space as well as programming time and maintenance efforts.

One relatively recent attempt to provide the benefits of after-placement inspection located within a pick a place machine itself is disclosed in U.S. Pat. No. 6,317,972 to Asai et al. That reference reports a method for mounting electric components where an image of a mounting location is obtained prior to component placement, and compared with an image of the mounting location after component placement to inspect the placement operation at the component level.

While the disclosure of Asai et al. marks one attempt to employ in-machine component level inspection, there remains much work to be done. For example, the disclosure of Asai et al. teaches acquiring two images before and after the placement of the component to determine placement characteristics of the component. While this approach is useful for determining the absence or presence of a component after placement, there are several important machine characteristics of the placement machine that can cause placement errors of components that this approach does not address.

One major contributing factor to the quality of the component placement is movement and vibration of the workpiece during the placement operation. Such vibration and/or motion of the workpiece can be caused by: the length of the nozzle; the distance of vertical travel of the nozzle during the placement cycle; the rigidity of the workpiece; and the placement of workpiece support.

To increase the viability of component level placement inspection in a pick and place machine, it would be advantageous to remove or minimize the effects of such motion. Reduction of vibration and/or motion effects would allow components to be placed more accurately thereby facilitating the cost effect manufacture or smaller-scale and/or higher density workpieces. Moreover, reduction or elimination of motion effects may allow components to be placed more quickly since the pick and place machine would not require as much time between ceasing relative x-y motion between the nozzle and the workpiece and placing the component.

SUMMARY OF THE INVENTION

Embodiments of the present invention improve upon component level inspection performed by pick and place machines. Such improvements include detecting and measuring the motion or vibration of the workpiece during the placement cycle to determine the rigidity of the workpiece and proper placement of workpiece supports and the distance the nozzle travels during the placement cycle. Using embodiments of the present invention, the operation of the pick and place machine can be optimized or at least improved through analysis of workpiece vibration, proper design and placement of the board support mechanisms including the elimination of needed pins, the length and status of the placement nozzles, and verification of using the correct vertical travel for the nozzles.

In one embodiment, images taken of the placement location before and after the component placement are compared to determine the movement of the workpiece during the placement cycle.

In another embodiment, an image acquired using a long exposure time is used to measure the movement of the workpiece during the placement cycle. Using the long exposure image, the amount of movement of the workpiece during the placement cycle is determined by measuring the amount image blur caused by the board motion.

In yet another embodiment, multiple images are acquired over a single placement cycle and the image sequence is analyzed to determine a characteristic of the placement operation.

In another embodiment, multiples images are acquired over the assembly of multiple workpieces, each image taken at slightly different points during the placement cycle. Taken together, the multiple images are combined to generate a sequence of images forming a movie of the placement operation. Using this image sequence, multiple machine setup parameters can be examined and adjusted to optimize the placement operation.

In still another embodiment, the nozzle is examined to determine if the nozzle is configured properly. Using this technique, the length of the nozzle and the distance traveled by the nozzle tip is measured to determine if the pick and place machine is setup properly.

These and other advantages of embodiments of the present invention will be apparent from the description below.

BRIEF DESCRIPTION OF THE DRAWINGS

FIG. 8 is a diagrammatic view of the image captured by the image acquisition device before (FIG. 8a) and after (FIG. 8b) the placement of a component on the workpiece.

FIGS. 10a-10h are diagrammatic views of a sequence of images showing the placement cycle acquired using the image acquisition device over the assembly of several workpieces.

DETAILED DESCRIPTION OF ILLUSTRATIVE EMBODIMENTS

Embodiments of the present invention generally measure the travel of a pick and place machine placement nozzle and the motion characteristics of the workpiece through the placement process. Since the component is placed on the workpiece with some force to ensure proper adhesion to the workpiece, some deflection of the workpiece is expected during the placement cycle. The placement force is adjusted to ensure that the component is safely placed into the solder paste or adhesive. Placement force is adjusted through a number of characteristics including: choice of spring tension in the nozzle; the length of the nozzle and the amount of over-travel into the board; the rigidity of the board and design; and the placement of the board support mechanisms. With proper adjustment of these characteristics and parameters, high quality placements onto the workpiece can be ensured. To properly adjust these parameters, a method of measuring the workpiece motion and nozzle travel is required.

Figure 1:
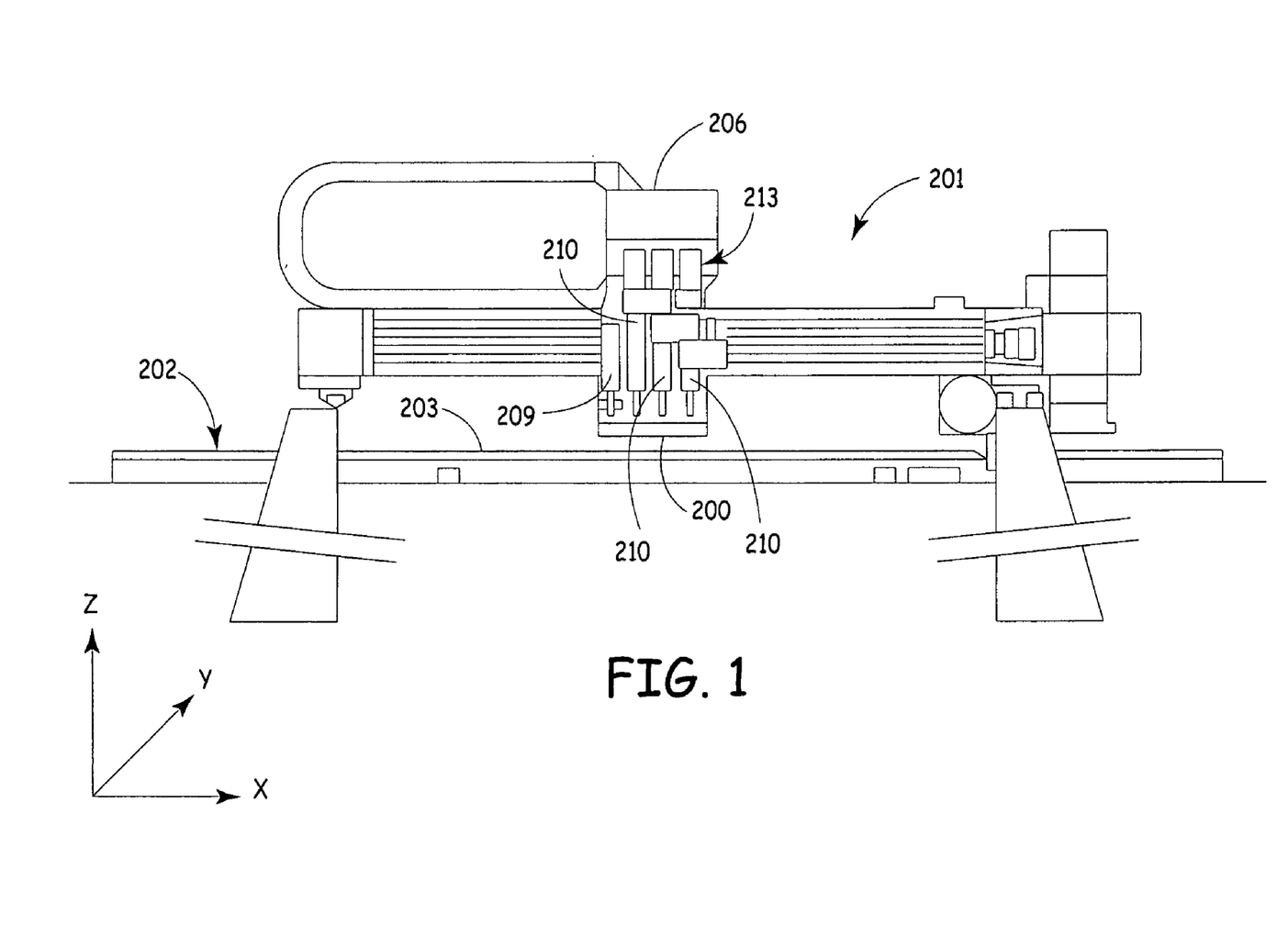
FIG. 1 is a diagrammatic view of a Cartesian pick and place machine with which embodiments of the invention can be practiced.

FIG. 1 is a diagrammatic view of an exemplary Cartesian pick and place machine 201 with which embodiments of the present invention are applicable. Pick and place machine 201 receives a workpiece, such as circuit board 203, via transport system or conveyor 202. A placement head 206 then obtains one or more electrical components to be mounted upon workpiece 203 from component feeders (not shown) and undergoes relative motion with respect to the workpiece in x, y and z directions to place the component in the proper orientation at the proper location upon workpiece 203. Placement head 206 may include an alignment sensor 200 that may pass under components held by nozzles 210 as placement head 206 moves the component(s) from pickup locations to placement locations. Sensor 200 allows placement machine 201 to view undersides of components held by nozzles 210 such that component orientation and, to some degree, component inspection can be effected while the component is being moved from the component pick-up location to the placement location. Other pick and place machines may employ a placement head that moves over a stationary camera to image the component. Placement head 206 may also include a downwardly-looking camera 209, which is generally used to locate fiducial marks upon workpiece 203 such that the relative location of placement head 206 with respect to workpiece 203 can be readily calculated.

Figure 2:
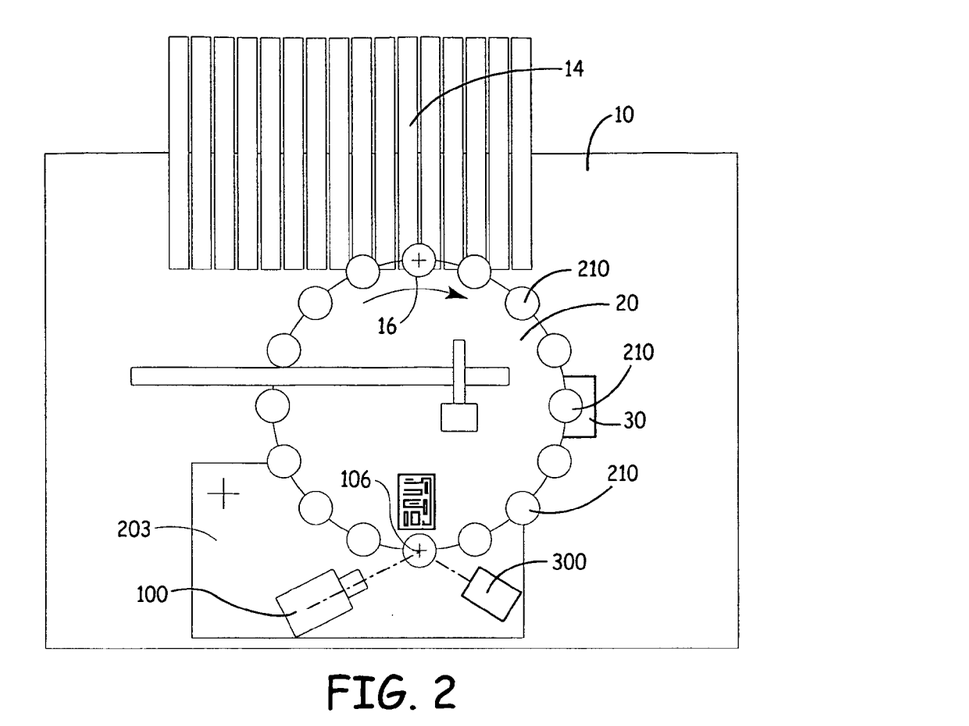
FIG. 2 is a diagrammatic plan view of a turret pick and place machine with which embodiments of the invention can be practiced.

FIG. 2 is a diagrammatic view of an exemplary rotary turret pick and place machine 10 with which embodiments of the present invention are applicable. System 10 includes some components that are similar to machine 201 and like components are numbered similarly. For the turret pick and place machine 10, the workpiece 203 is loaded via a conveyor onto an x-y stage (not shown). Placement nozzles 210 are attached to main turret 20 and are disposed at regular angular intervals around the rotating turret. During each pick and placement cycle, the turret indexes an angular distance equal to the angular distance between adjacent placement nozzles 210. After the turret rotates into position and the workpiece 203 is positioned by the x-y stage, a placement nozzle 210 obtains a component (not shown in FIG. 2) from a component feeder 14 at a defined pick point 16. During this same interval, another nozzle 210 places a component onto the workpiece 203 at a preprogrammed placement location 106. Additionally, while turret 20 pauses for the pick and place operation, an upward-looking camera 30 acquires and image of another component, which provides alignment information for that component. This alignment information is used by pick and place machine 10 to position the workpiece 203 when the corresponding placement nozzle is positioned several steps later to place the component. After the pick and place cycle is complete, turret 20 indexes to the next angular position and workpiece 203 is repositioned in x-y direction to move the placement location to a position that corresponds to the placement location 106.

Figure 3:
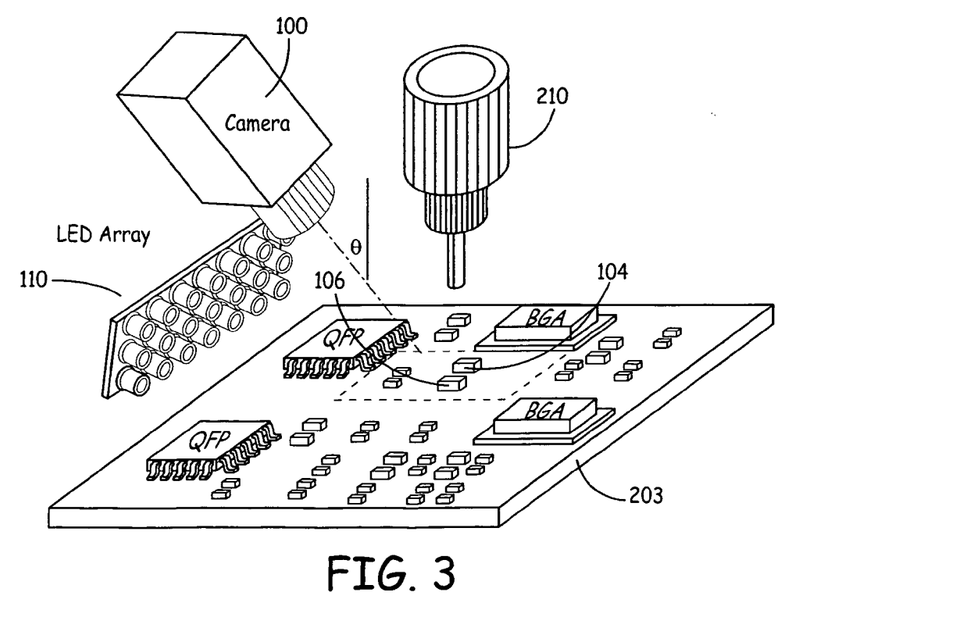
FIG. 3 is a simplified diagrammatic view of an image acquisition system aligned with the placement point of a component placement machine.

FIG. 3 is a diagrammatic view of a placement head in accordance with embodiments of the present invention. FIG. 3 illustrates an image acquisition device 100 disposed to acquire images of placement location 106 of component 104 before and after the component 104 is deposited by nozzle 210 upon location 106. Device 100 obtains images of placement location 106 on workpiece 203 prior to placement of component 104 and then shortly thereafter. A comparison of these before and after images facilitates component-level placement inspection and verification. In addition, the area surrounding the component placement location 106 is also imaged. Since acquisition of images of the placement location is generally done when the nozzle, such as nozzle 210, holds component 104 above the placement location, it is important to be able to image placement location 106 while minimizing or reducing interference from the component itself or adjacent components which may be already mounted upon the workpiece. Thus, it is preferred that the device 100 employ an optical axis allowing views that are inclined at an angle θ with respect to the plane of workpiece 203. It is also necessary to precisely time the image acquisition interval such that the workpiece 203 and the placement nozzle 210 are relatively aligned with each other and the component is high enough above workpiece 203 to visualize workpiece 203 from the camera angles. After component 104 is placed, the second image must be timed properly to acquire an image at a predetermined time during the placement cycle. A method to precisely time the acquisitions of these two images is described in a co-pending patent application Ser. No. 10/970,355 filed Oct. 21, 2004, and entitled Pick and Place Machine with Improved Component Placement Inspection.

Figure 4:
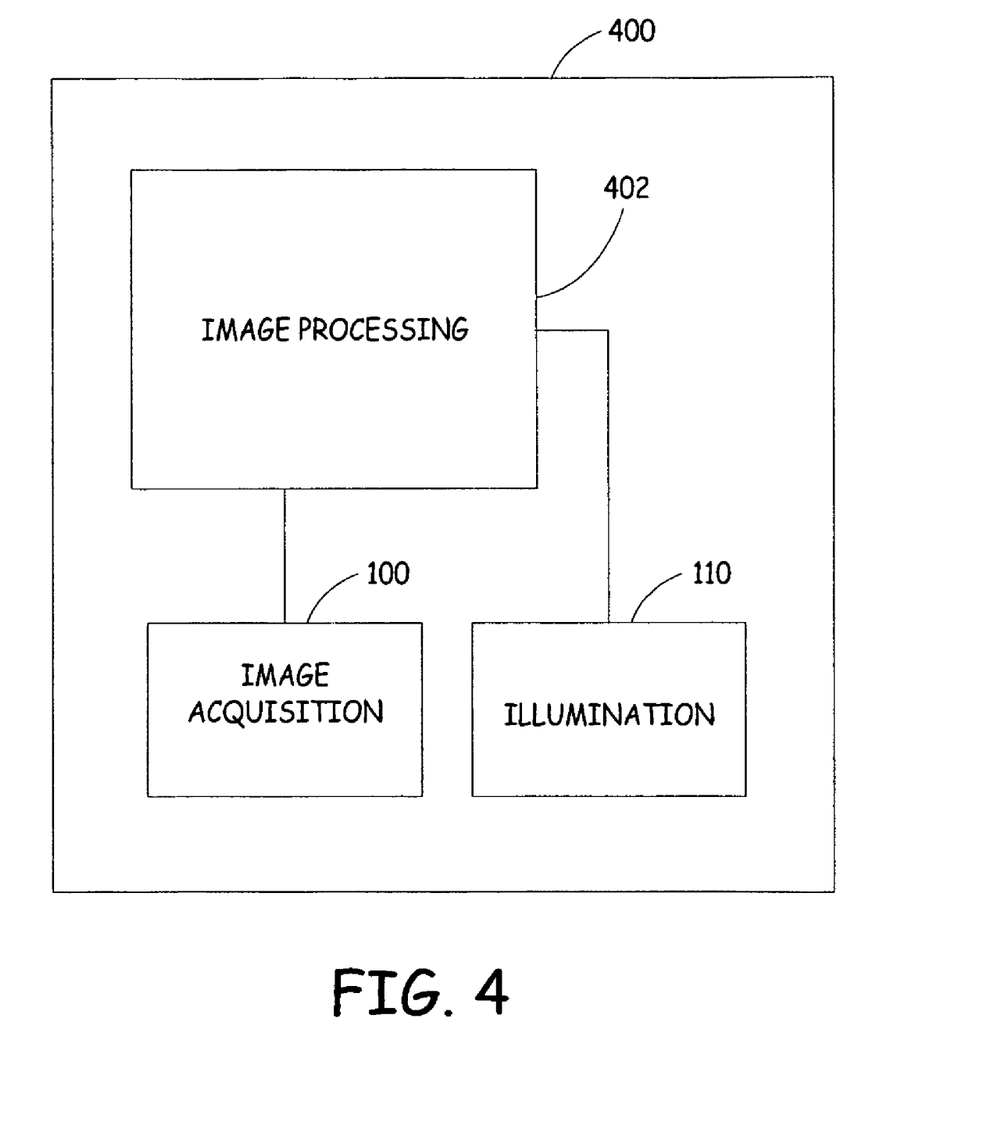
FIG. 4 is a diagrammatic view of an image acquisition system for use in pick and place machines in accordance with embodiments of the present invention.

FIG. 4 is a diagrammatic view of an image acquisition system for use in pick and place machines in accordance with embodiments of the present invention. Image acquisition system 400 includes image processing device 402 and image acquisition device 100. Image processing device 402 can be any suitable computing device including, without limitation, a microprocessor, a personal computer, a distributed computing system, or any other suitable device that can operate upon the image data from image acquisition device 100. Image processing device 402 can be disposed in the same housing as image acquisition device 100, or device 402 can be located remotely from device 100. Image acquisition system 400 also optionally includes illuminator 110 coupled to image processing device 402. In embodiments where ambient illumination is sufficient for effective image acquisition, illuminator 110 may be eliminated. However, the use of an illuminator, preferably coupled to image processing device 402, allows device 402 to control illumination timing as well as image acquisition timing. This allows essentially frozen images to be captured since the illuminator can be strobed.

Embodiments of the present invention generally obtain two or more successive images of the intended placement location (i.e. before placement and after). Since placement occurs relatively quickly, and since slowing machine throughput is extremely undesirable, it is sometimes necessary to acquire two successive images very quickly since cessation of the relative motion between the placement head and the board is fleeting. For example, it may be necessary to acquire two images within a period of approximately 10 milliseconds.

In accordance with various aspects of the present invention, rapid acquisition of multiple successive images can be done in different ways. One way is using commercially available CCD devices and operating them in a non-standard manner to acquire images at a rate faster than can be read from the device. Further details regarding this image acquisition technique can be found in U.S. Pat. No. 6,549,647, assigned to the Assignee of the present invention. Yet another way to rapidly acquire multiple successive images is to use multiple CCD arrays arranged to view the intended placement location through common optics.

Figure 5A:
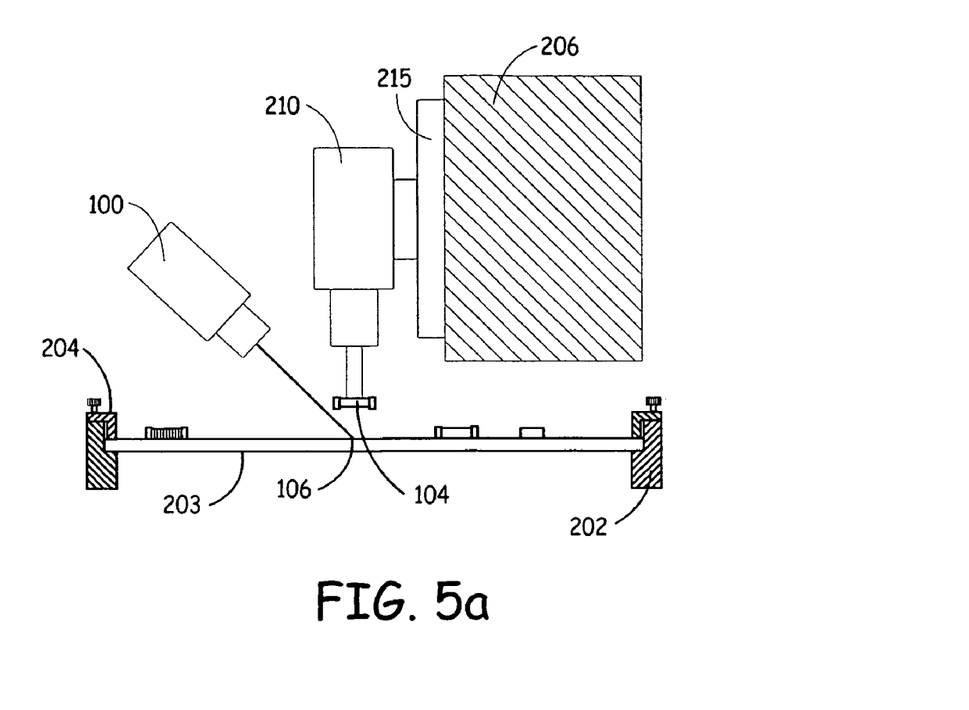
FIG. 5a is a diagrammatic side view image of a circuit board prior to component placement
Figure 5B:
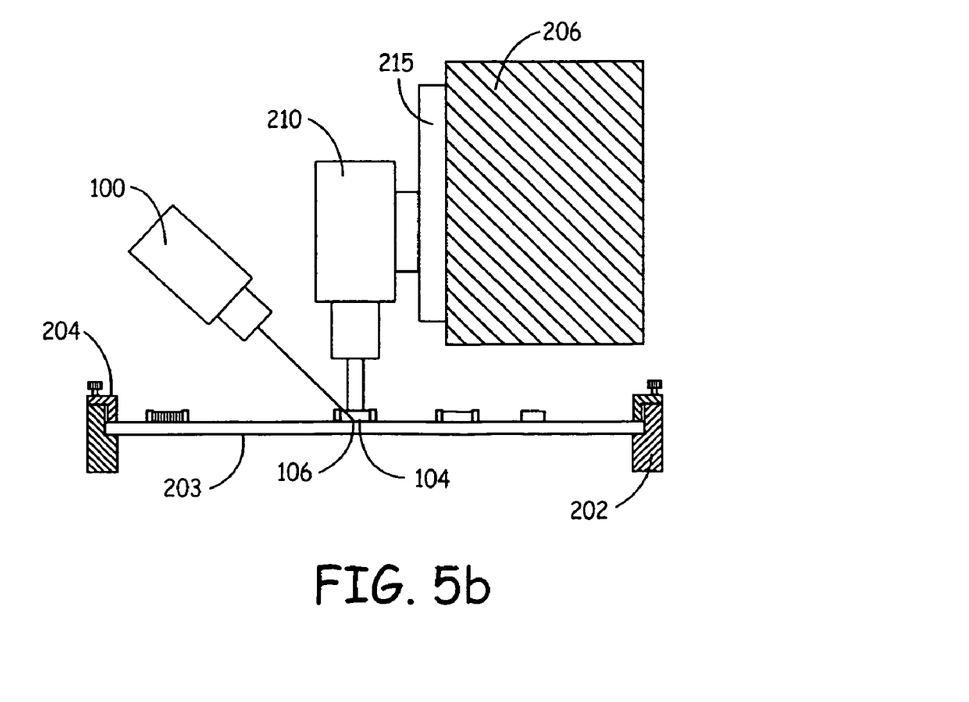
FIG. 5b is a diagrammatic side view image of a circuit board just as the component makes contact with the circuit board.
Figure 5C:
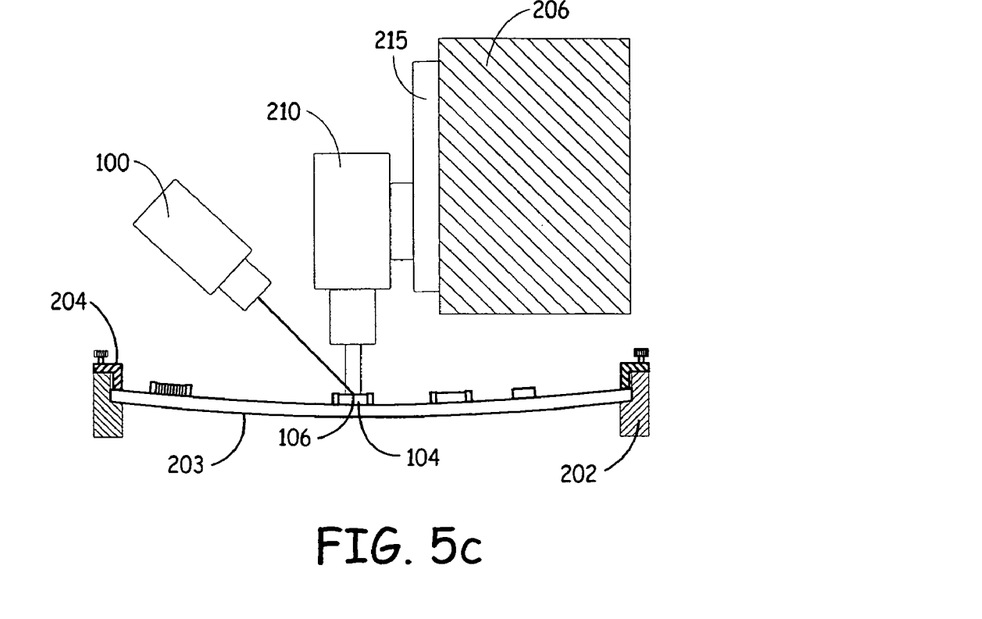
FIG. 5c is a diagrammatic side view image of a circuit board showing nozzle travel deflecting the workpiece downward.
Figure 5D:
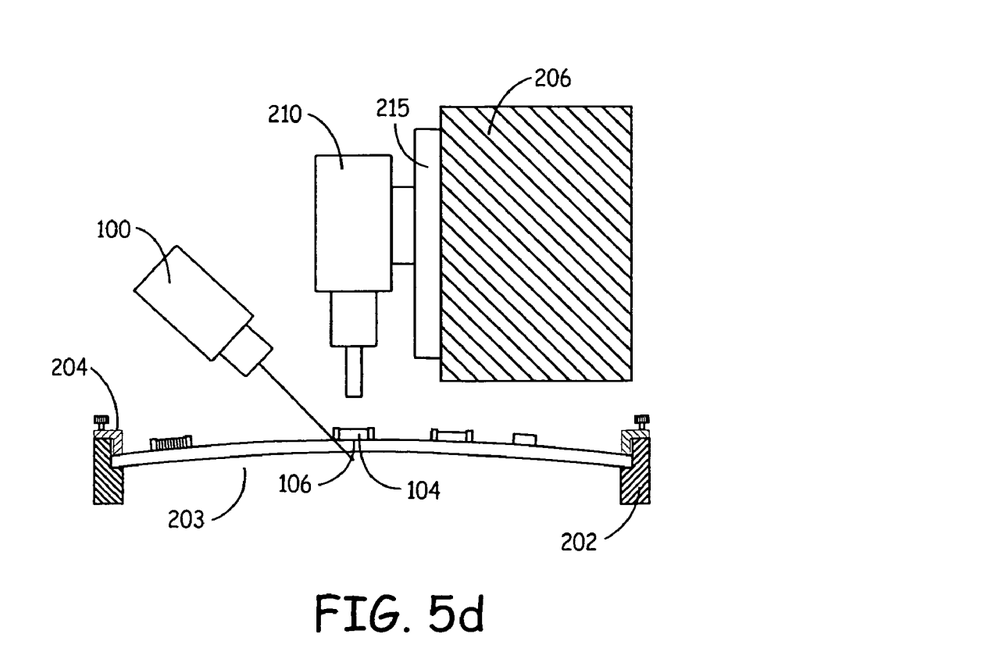
FIG. 5d is a diagrammatic side view image of a circuit board after the nozzle has been retracted and the workpiece is rebounding upward.
Figure 5E:
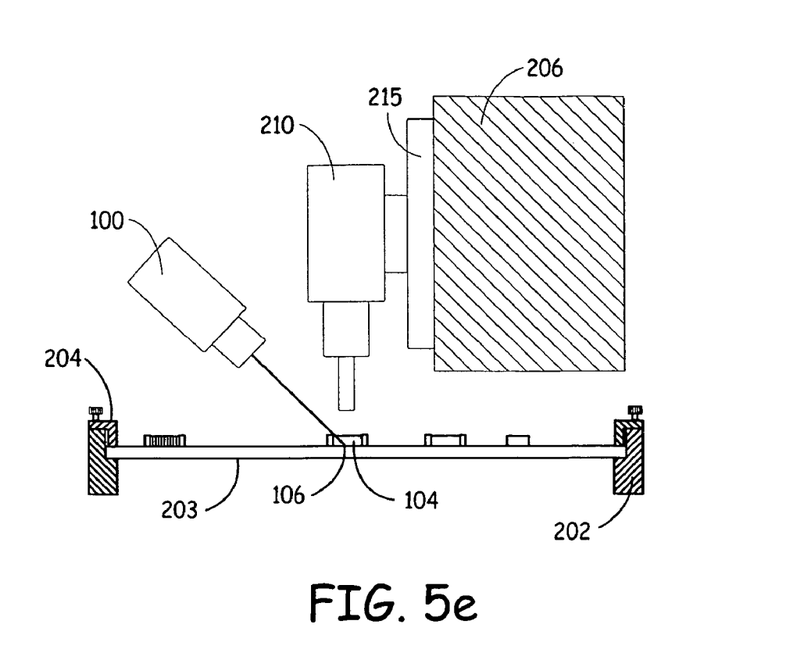
FIG. 5e is a diagrammatic side view image of a circuit board after the component is placed and the workpiece comes to rest in its nominal position.
Figure 6:
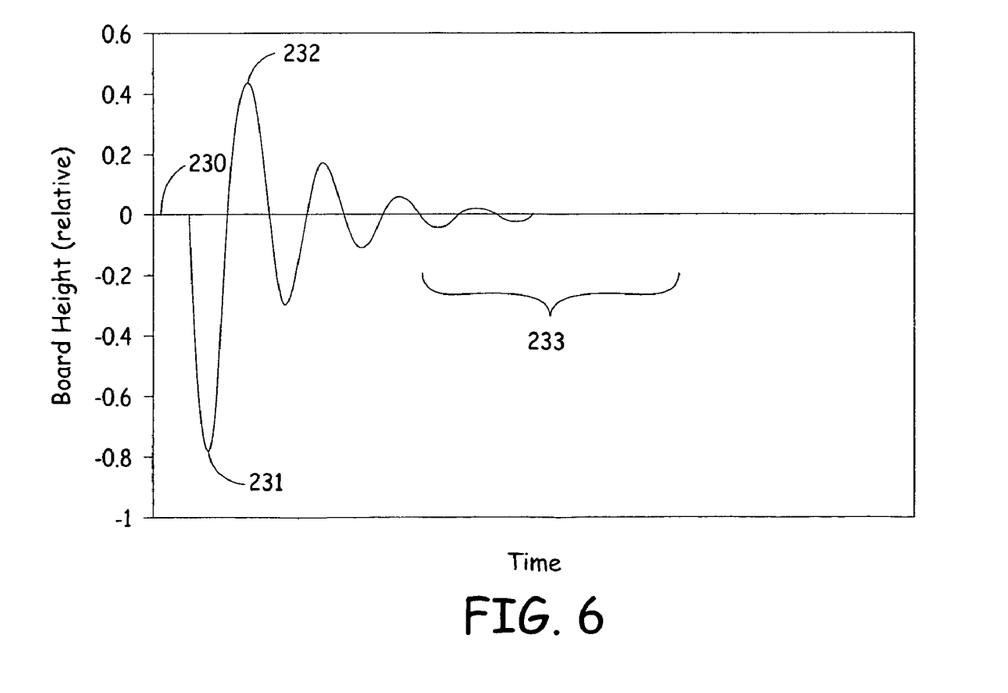
FIG. 6 is a typical plot of relative vertical motion of a workpiece during a placement cycle.

During placement, component 104 is pushed down on workpiece 203 with enough force to ensure adhesion to workpiece 203. Typically, solder paste or an adhesive is deposited on placement site 106 prior to component placement to provide the adhesion of component 104 to workpiece 203. FIG. 5 shows the placement cycle from a side view. In FIG. 5a, component 104 is moved into alignment with workpiece 203, which is held in place by workpiece conveyor 202 and workpiece clamping mechanism 204. In FIG. 5b, vertical motion mechanism 215 of placement head 206 moves nozzle 210 downward until the component 104 just touches the workpiece 203. To ensure proper adhesion to workpiece 203, component 104 is pushed further down onto workpiece 203, causing workpiece 203 to deflect down as shown in FIG. 5c. As the nozzle 210 retracts, workpiece 203 typically rebounds and oscillates around its nominal position as shown in FIG. 5d. Finally, the workpiece motion will dampen out and come to rest in the workpiece's nominal position as shown in FIG. 5e. The graph in FIG. 6 represents the position of the workpiece 203 during the placement cycle. Before component 104 touches workpiece 203, workpiece 203 has little vertical motion 230. At point 231 in FIG. 6, the placement nozzle has reached the full extent of its vertical travel, pushing the workpiece 203 to its lowest point in its motion profile. After the nozzle 210 retracts, the workpiece 203 rebounds until it has traveled to its highest point 232. After some time, the motion will dampen out and the workpiece will return to its nominal position 233. To optimize the quality of placement, the amount of motion of workpiece 203 should be minimized while still allowing for enough downward force to ensure the component 104 is adhered to the workpiece 203.

Figure 7:
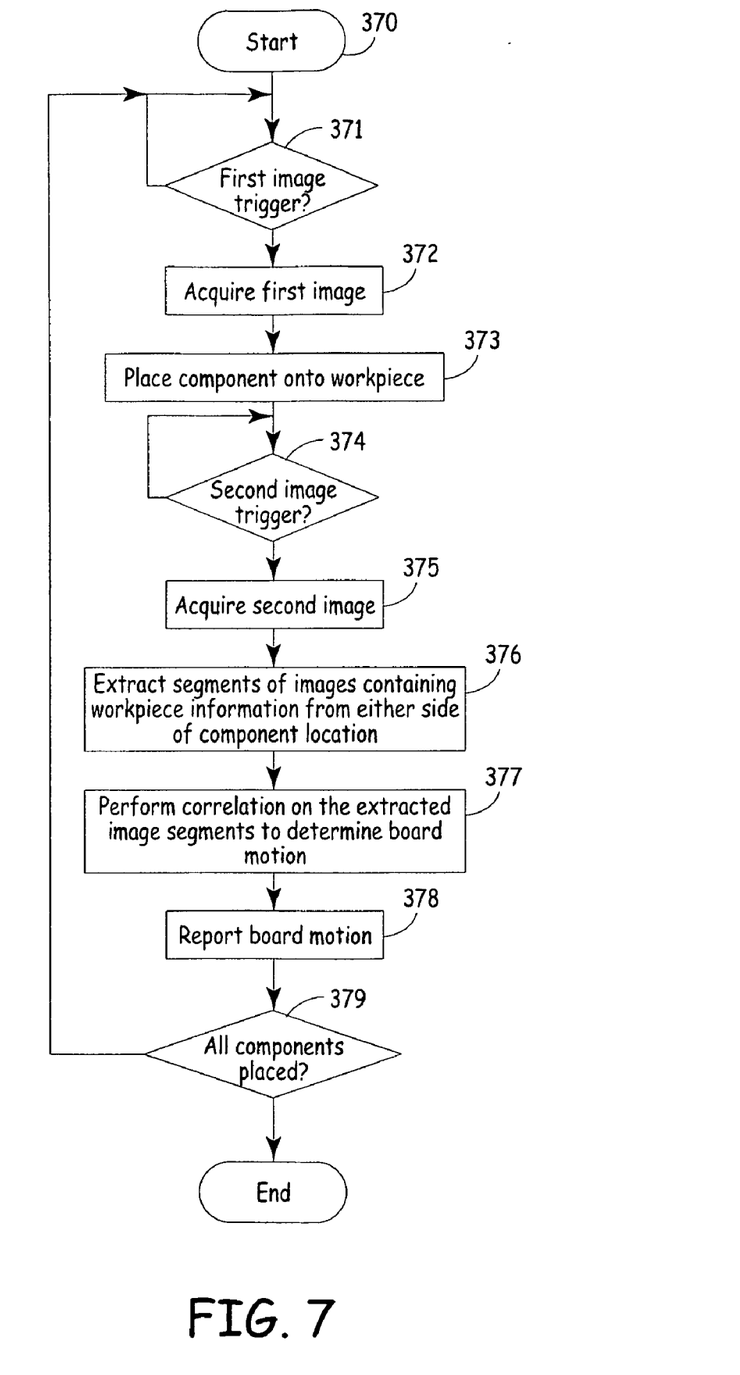
FIG. 7 is a block diagram of a method to determine the motion of the workpiece during a placement cycle.

FIG. 7 is a block diagram of process flow in accordance with a preferred embodiment of the invention. In block 371, image acquisition system 100 awaits a trigger that occurs right before the placement of the component. Once the trigger occurs, image acquisition system 100 acquires a first image 372. After component 104 is placed as indicated at block 373, image acquisition system 100 is triggered to acquire a second image as indicated at blocks 374, 375. Once the before and after images are acquired, segments of the images are defined and extracted that do not contain component placement area 106 or component 104. Common segments from each of the before and after images are compared to detect changes in the position of workpiece 203 between acquisition of the before and after images. Since image acquisition system 100 is disposed at an angle θ with respect to workpiece 203, any vertical motion of workpiece 203 will cause the image of workpiece 203 to translate in the images. One common image processing function that can perform this comparison is known as image correlation wherein the position of the correlation peak is a measure of workpiece motion.

Figure 8A:
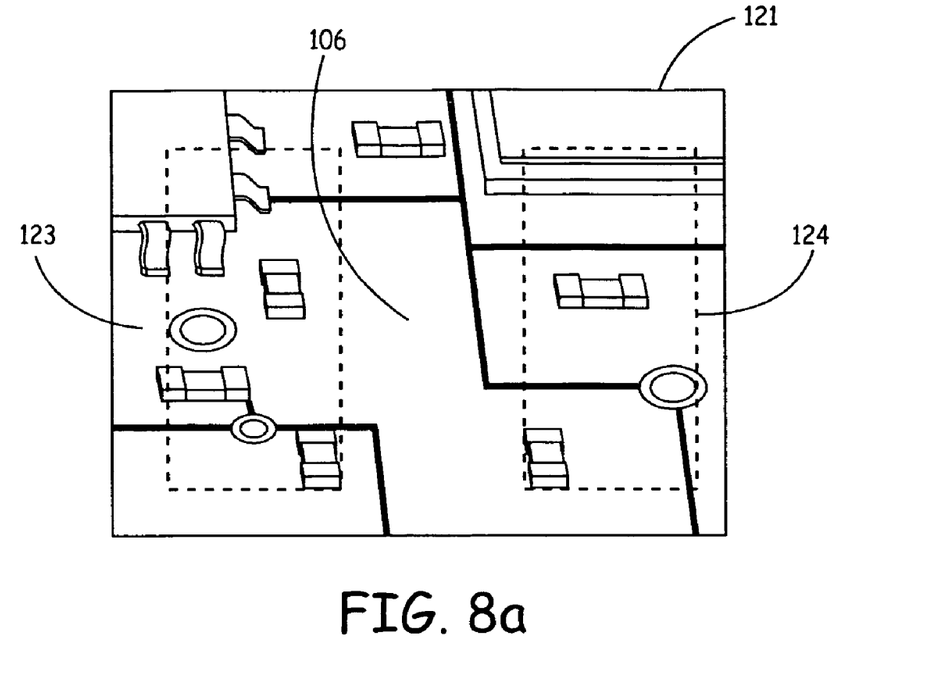
Figure 8B:
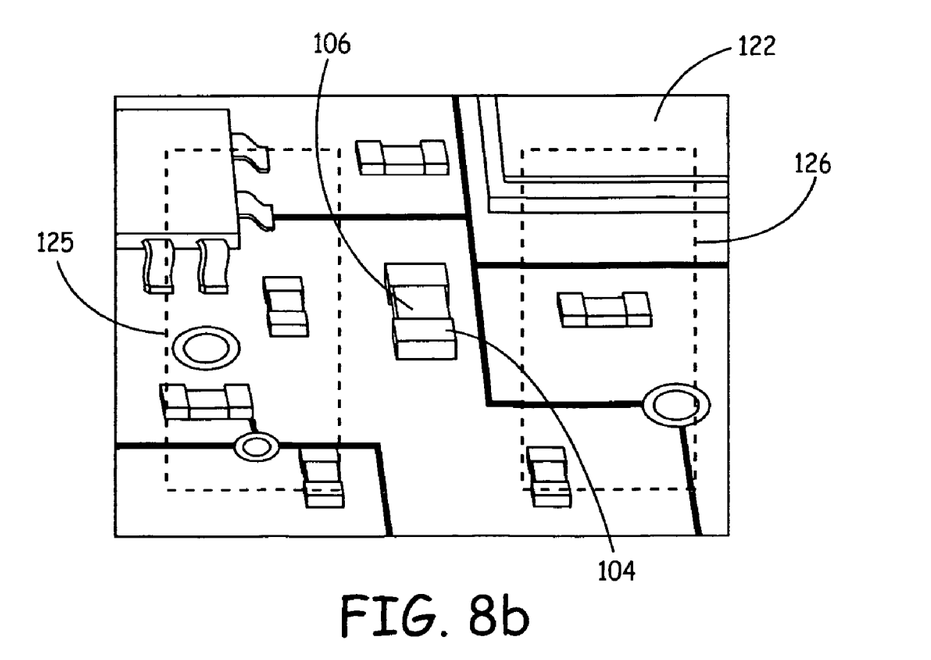

FIG. 8 shows an example of the image segmentation described above. FIG. 8a is an example of an image 121 acquired before component placement and FIG. 8b is an example of an image 122 acquired after component placement. In each image, at least one segment is defined for processing of workpiece motion. These segments are defined to contain information of the workpiece without containing information around the component placement area 106. FIG. 8. shows two segments 123, 124 in the pre-placement image 121 and two corresponding segments in the post-placement image 122. To determine the motion of the workpiece during the placement cycle, segment 123 is compared to segments 125; and segment 124 is compared to 126 to determine the relative motion of the workpiece 203. Comparison is performed by correlating the two images using any of a number of common image processing algorithms to compare feature positions between the two images.

Figure 9:
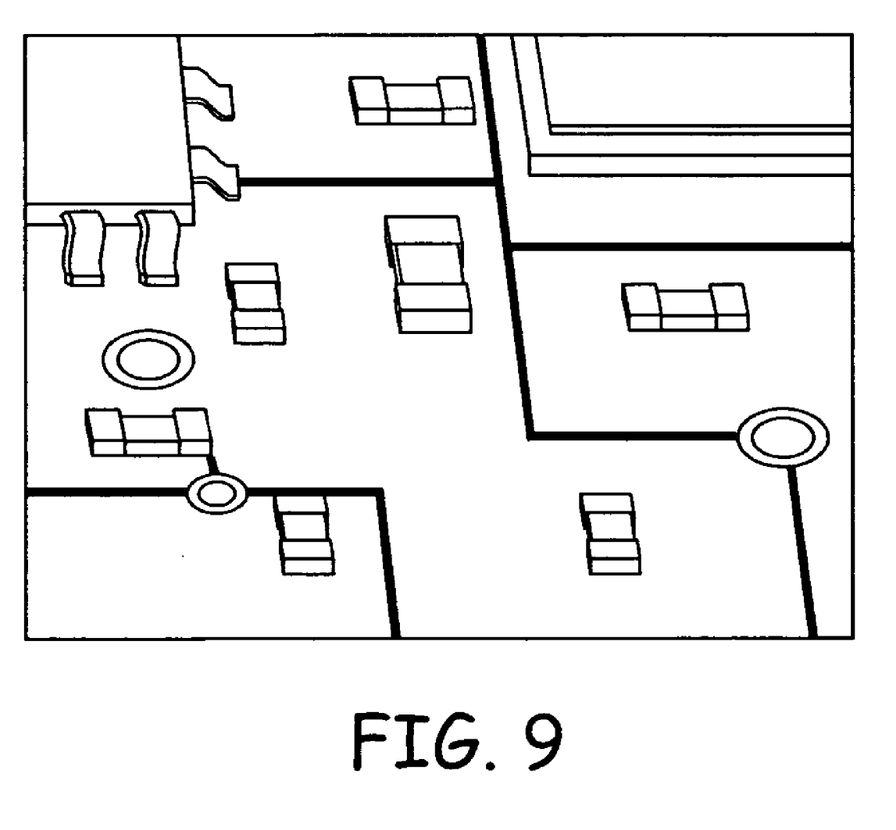
FIG. 9 is a diagrammatic view of the image captured by the image acquisition device during a placement cycle using a long exposure time
Figure 10A:
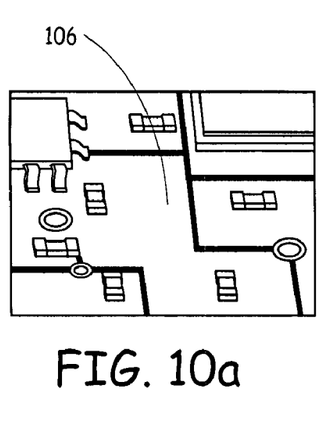
Figure 10B:
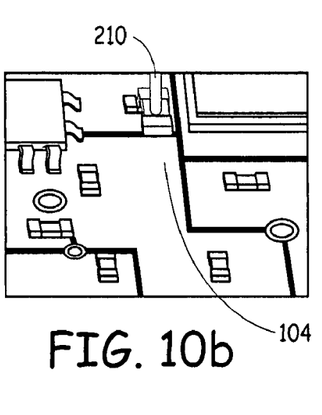
Figure 10C:
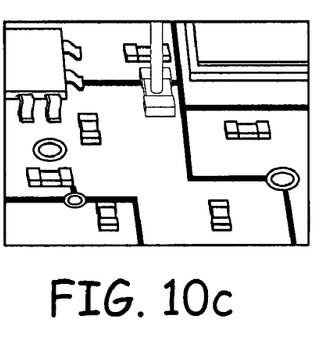
Figure 10D:
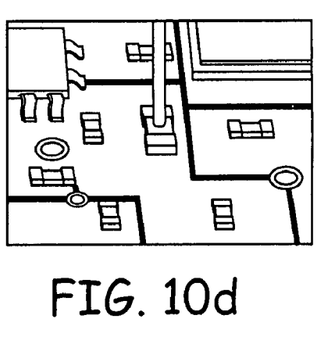
Figure 10E:
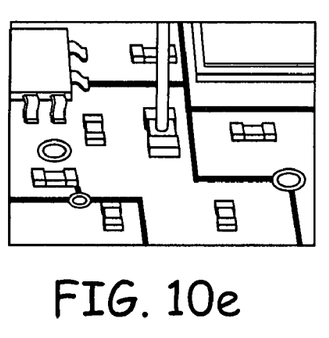
Figure 10F:
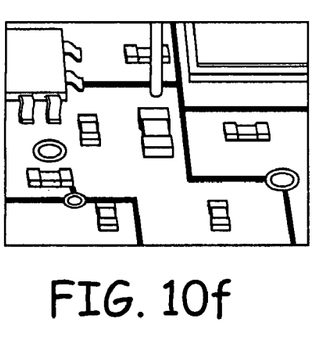
Figure 10G:
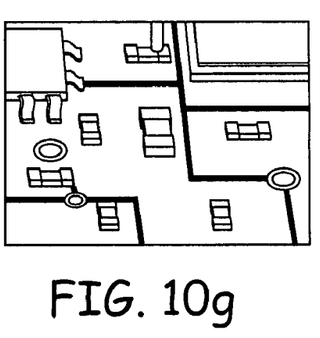
Figure 10H:
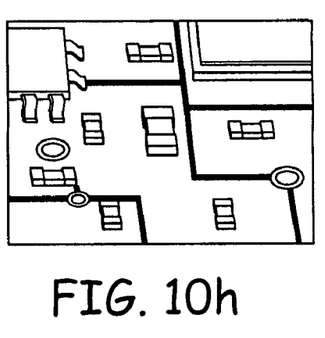

Two images can provide some information on the vibration of the workpiece. However, if the natural frequency of the workpiece is not known, or if the second image is not acquired during a peak of travel 231, two images will not be able to determine the maximum amount of travel undergone by the workpiece during the placement cycle. To ensure the maximum travel is measured, another embodiment of the invention can be used. In this embodiment, the second image is acquired using a long exposure time relative to the natural frequency of the workpiece. The resulting image of the long exposure time is shown diagrammatically in FIG. 9. By analyzing the length of the blur in the images, the extent of the workpiece motion can be measured. By correlating the before image with the blurred image, the length of the blur can be determined.

In accordance with another embodiment of the present invention, three or more images are acquired during the placement cycle to uniquely detect the motion profile as shown in FIG. 10. Multiple images like those shown in FIG. 10 can be acquired during one cycle by using a high-speed image acquisition device or by acquiring images over the process of assembling several workpieces. Assuming that the assembly conditions from one workpiece to another are relatively stable and acquiring images at slightly different trigger points for each workpiece, a sequence of images are assembled that represent a full placement cycle. To detect motion, segments of each of the images are compared to the first image to determine the relative motion in each image. Using multiple motion measurements, the motion profile of the workpiece during the placement cycle can be uniquely derived.

In accordance with yet another embodiment of the present invention, the same images are used to determine the length of the nozzle and the programmed vertical stroke of the nozzle used to place the component. In this embodiment, the images acquired during the placement are compared to measure the position of the nozzle at the farthest extent of its motion. By measuring the position of the nozzle at the farthest extent of its motion, placement defects due to nozzle problems can be detected. These problems include: bent nozzles; incorrect nozzle lengths; force placed on the component during placement (assuming knowledge of the nozzle compliant spring force); and incorrect programming.

Although the present invention has been described with reference to preferred embodiments, workers skilled in the art will recognize that changes may be made in form and detail without departing from the spirit and scope of the invention.

What is claimed is:

1. A pick and place machine for placing a component upon a workpiece, the machine comprising:
    a placement head having at least one nozzle for releasably holding the component, the placement head being configured to deliver the component to a placement location on the workpiece during a placement cycle;
    a robotic system for generating relative movement between the placement head and the workpiece;
    an image acquisition device disposed to obtain a plurality of images including the placement location of the component;
    an image processing device for analyzing the images generated by the image acquisition device, the image processing device being configured to segment each image to have an image portion that contains neither the placement location nor the component; and
    wherein the image processing device is configured to compare the segmented image portion in each of the plurality of images to measure vertical oscillation of the workpiece during the placement cycle.

2. The pick and place machine of claim 1, wherein the image processing device measures vertical oscillation by applying image correlation to the plurality of images.

3. The pick and place machine of claim 2, wherein a position of a correlation peak is indicative of the workpiece oscillation.

4. The pick and place machine of claim 1, wherein the pick and place machine is a Cartesian pick and place machine.

5. The pick and place machine of claim 1, wherein the pick and place machine is a turret pick and place machine.

6. The pick and place machine of claim 1, wherein at least one of the plurality of images is a blurred image acquired using an exposure time that is longer than a period of a natural frequency of the workpiece.

7. The pick and place machine of claim 6, wherein the measured vertical oscillation is a function of a blur length in the blurred image.

* * * * *

UNITED STATES PATENT AND TRADEMARK OFFICE
CERTIFICATE OF CORRECTION

| | | |
|---|---|---|
| PATENT NO. | : 7,706,595 B2 | Page 1 of 1 |
| APPLICATION NO. | : 10/978687 | |
| DATED | : April 27, 2010 | |
| INVENTOR(S) | : Bushman et al. | |

It is certified that error appears in the above-identified patent and that said Letters Patent is hereby corrected as shown below:

Title Page, Item (56) Other Publications, insert --First Office Action from Chinese patent application no. 200580033036.9, filed October 5, 2005.--

Signed and Sealed this

Twenty-third Day of November, 2010

David J. Kappos
*Director of the United States Patent and Trademark Office*